United States Patent [19]

Kalbfus et al.

[11] 4,412,153
[45] Oct. 25, 1983

[54] DUAL FILAMENT ION SOURCE

[75] Inventors: Charles R. Kalbfus, Stromville, N.Y.;
Norman L. Turner, Gloucester, Mass.

[73] Assignee: Varian Associates, Inc., Palo Alto, Calif.

[21] Appl. No.: 293,026

[22] Filed: Aug. 14, 1981

Related U.S. Application Data

[63] Continuation of Ser. No. 126,225, Mar. 3, 1980, abandoned.

[51] Int. Cl.³ ............................................. H01J 7/24
[52] U.S. Cl. ............................ 315/111.81; 250/427;
315/111.91; 313/453
[58] Field of Search .............................. 250/425, 427;
315/111.8, 111.9

[56] References Cited

U.S. PATENT DOCUMENTS 3,484,602 12/1969 McIlraith ............................ 250/427
3,701,915 10/1972 Tsujimoto .......................... 313/453
3,784,858 1/1974 Franks .................................. 313/63

OTHER PUBLICATIONS

Gas Discharge Ion Source by Bickes et al. Rev. Sci. Inst., vol. 49, No. 11, Nov. 1978, pp. 1513–1517.

Primary Examiner—Harold A. Dixon
Attorney, Agent, or Firm—Stanley Z. Cole; Norman E. Reitz; William R. McClellan

[57] ABSTRACT

An electron bombardment ion source of the Freeman type incorporates an electrode having multiple segments which are electrically connected in parallel to provide increased surface area for constant cross section.

6 Claims, 5 Drawing Figures

DUAL FILAMENT ION SOURCE

This application is a continuation of application Ser. No. 126,225, filed Mar. 3, 1980, now abandoned.

DESCRIPTION

This invention relates to an ion source having increased lifetime, ionization efficiency and brightness and, more particularly, relates to a multiple filament ion source of the hot filament Freeman configuration surface emission type.

Ion sources are utilized in particle accelerators and in commercial ion implanters. A wide variety of ion source types have been developed. See, e.g., R. G. Wilson et al., Ion beams with Applications to Ion Implantation (1973), p. 45 et. seq. The most common sources include the Penning-cold cathode source, the Chevat hot filament source, the Bernas source and the Freeman hot filament source. These sources are characterized by their ion current production, ionization efficiency and brightness. These characteristics will vary from source to source and will be matched to the requirements of a particular application.

In commercial ion implantation equipment it is highly desirable to have an ion source which is reliable, relatively energy efficient and which has a long lifetime. Long lifetimes reduce the downtime of the ion implanters in which the sources are installed and may reduce the cost of ion source replacement. A common ion source for implantation, among those listed above, is the heated cathode (filament type) Freeman configuration ion source. A single filament is located in the ionization chamber generally parallel to the exit aperture through which ions produced in the chamber are extracted. The cathode filament is negatively biased and heated to emission temperature to provide an adequate supply of electrons for electron impact ionization of gasses introduced to the ionization chamber. The surface area of the cathode filament constitutes the active area for the emission of energetic electrons. The electron impact ionization of the gas creates plasma. The plasma density is a function of the ionization chamber pressure, electron emission and cathode potential. Positive ions are then extracted from the plasma by means of a high potential field, and emerge through an exit aperture found in the wall of the ionization chamber as an ion beam to be used for implantation.

The power consumed by a filament at a given temperature is a function of its resistivity and thus is a function of its elemental conductivity and its cross section. Thus, generally the use of two filaments having a combined cross section equal to the cross section of a single filament results in no increase in power consumption but increases the surface area for emission. See, for example, U.S. Pat. No. 1,722,468, p.2, lines 24-41. Multiple, most usually dual filaments have been used in light bulbs to produce greater brightness without increasing the filament diameter or current (See U.S. Pat. No. 976,247, "Incandescent Lamp"), to permit connection of low resistance filament bulbs into high potential commercial lighting circuits (See U.S. Pat. No. 1,104,807, "Incandescent Lamp") or for a lamp in which the dual filament are serially connected and folded back to produce a compact lamp (U.S. Pat. No. 3,555,342, "Single-Ended Incandescent Projection Lamp Having Dual Series-Connected Filaments and an Integral Gripping Cap"). In these applications the filaments are heated in a vacuum or inert gas and the purpose is to produce visible wavelength radiation; there is no need to sustain an ionizing reaction in an enclosed chamber. In fact, radiative emission per se is the goal, not containment to produce a secondary effect. With electron beam gun sources dual filaments have been used to produce greater electron beam power, to obtain redundancy and to avoid filament degradation due to backstreaming ions. See U.S. Pat. No. 3,701,915, "Electron Beam Gun" and U.S. Pat. No. 3,172,007, "Folded Filament Beam Generator." Here too there is no need to confine the electrons to the chamber; rather, the electrons travel from the filament into the electron beam with a minimal residence time in the filament housing area. Filament springs and housing geometries are selected to accomplished the generation and ready extraction of electrons.

In linear ion sources of the hot filament Freeman type in the prior art the filament has typically been mounted within the chamber and centered with respect to the extraction slit. Most electrons generated by the filament stay within the chamber and have a statistical chance of colliding with a molecule of the gaseous source species to produce an ionized atom. These ionized atoms are then extracted electrostatically through the extraction slit of the ionization chamber. These ions are directed, with or without analysis or scanning, towards a target such as a semiconductor wafer.

It is an object of the present invention to provide a hot filament surface ionization ion source with enhanced lifetime.

It is an additional object of the present invention to reduce filament operating temperature in a hot filament surface ionization source.

It is another object of the present invention to provide a multiple filament ion source to increase surface area for a given power consumption.

BRIEF DESCRIPTION OF THE DRAWINGS

For a more complete understanding of the multiple filament ion source of the present invention reference may be had to the accompanying drawings which are incorporated herein by reference and in which.

SUMMARY OF THE INVENTION

Figure 1:
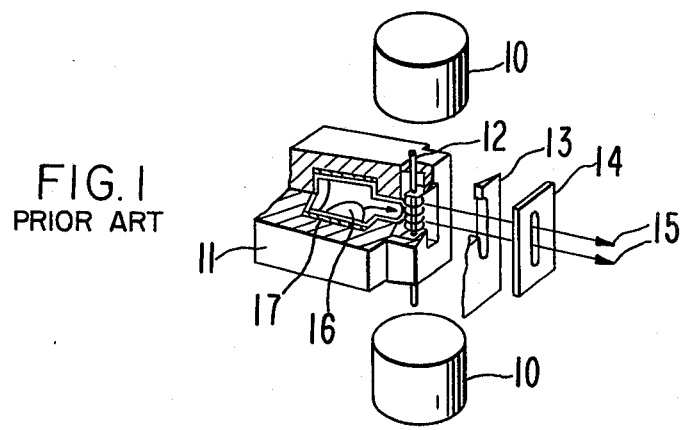
FIG. 1 is a pictorial view of an ion source of the Freeman configuration surface emission type of the prior art.

A multiple filament ion source of the electron impact ionization type is provided which produces an ion beam equivalent to that of a single filament source yet operates at a reduced filament temperature. Reduced filament operating temperature results in enhanced filament lifetime. Filament emission, a function of surface area and temperature, is maintained constant even though temperature is reduced since the surface area is increased through the use of multiple filaments. Power consumption is kept constant or reduced by keeping a constant aggregate cross section or reducing the aggregate cross section. When the cross section is reduced, surface area is increased sufficiently to keep the emission high enough to produce equivalent source performance. Additional lifetime in a preferred embodiment is obtained by straddling the extraction slit with the multiple filaments thereby eliminating filament degradation.

DESCRIPTION OF THE PREFERRED EMBODIMENT

Electron-impact ion sources are useful for practical applications, because they are capable of producing a wide range of ion currents and a wide variety of ionic species and may be used to produce either broad or focused beams. With such sources a conductive wire or rod electrode is positioned within the ionization chamber (also sometimes called the arc chamber or reaction chamber) and is heated by the passage of electrical current. Electrons are produced by thermionic emission around the surface. An ionizable material is introduced in vapor form to the chamber and the elecrons collide with atoms or molecules of this material to form ions. The electrode serves as the cathode and the walls of the ionization chamber as the anode with ionizing collisions occurring inbetween. These ions are extracted through an aperture by means of a high electrostatic field gradient and are directed externally to a target or substrate. This type of impact ionization source is divided into two general categories: broad and focused sources. Kaufman sources are broad beam sources used, for example, in ion thrusters for space propulsion, in ion milling and in reactive ion etch applications. These sources have relatively large area extraction apertures and are often circular in shape with typically a single filament and multiple magnetic field poles configured within an ionization chamber. See, e.g., G. C. Isaacson, "Multipole Gas Trusters", Ph.D. Thesis, University of Colorado (1977). These sources may also have two semicircular filaments mounted within the cylindrical ionization chamber. See, e.g., the Model 15-1500-150 ion source of Ion Tech, Inc., Ft. Collins, Colo. On the other hand, Freeman sources (also known as Calutron sources) of the hot filament type are narrow or focused beam sources which are used, for example, in the ion implantation of semiconductor wafers in conjunction with beam analysis and focusing in order to achieve high uniformity. A typical focused source would have an elongated extraction slit to produce a ribbon shaped beam. In each case the electrode will be located within the ionization chamber and will have a specified size, shape, material and orientation with respect to the extraction aperture.

A primary degradation mechanism for electrodes in impact ionization ion sources is the emission of the electrode materials. The elemental or molecular constitutents of the electrode materials are expelled from the surface (boil off the surface) at elevated operating temperatures. See, e.g., R. E. Honig, et al., "Vapor Pressure Date for the Solid and Liquid Elements", RCA Review, v. 30, p.285 (1969). This loss of material eventually reduces the diameter of the electrodes to the point where the rod or wire breaks. These losses occur at the highest rates in a vacuum but are still significant in a plasma or aqueous environment. This loss mechanism is at least a second order exponential function of temperature. Thus, the rate of loss is significantly increased for differential increases in temperature; conversely the rate of loss is significantly decreased for differential reductions in temperature. Thus, for reduced operating temperatures, the rate of loss of material due to surface emission will be reduced and lifetime increased.

In order to optimize the operating characteristics (lifetime, ionization efficiency, brightness, reproducibility and consistency) of impact ionization sources, new configurations for the ionization chamber and electrodes have been adopted and the preferred placement of electrodes within ionization chambers has been empirically determined. These approaches have been adopted to produce magnetic confinement within certain regions of the ionization chamber; i.e., the residence time of certain species must be enhanced in these regions. In particular, electrons must be restrained from reaching the anode until they have expended most of their kinetic energy in inelastic, ion-producing collisons. Also, neutral atoms must be confined within the ionization chamber until they are ionized, i.e., they should not be allowed to easily reach the extraction aperture or slit where they might escape and make no contribution to the ion beam. And ions must not be allowed to reach the walls of the ionization chamber or they will have to be re-ionized. See generally, D. Bohm, "Qualitative Description of the Arc Plasma in a Magnetic Field", *The Characteristics of Electrical Discharges in Magnetic Fields*, A. Guthrie and R. K. Wakerling, eds., McGraw-Hill (1949). In addition, photon trapping has been shown to affect ionization rates. See, e.g., W. Knauer, "Mechanism and Efficiency of the Ion Generation Process in Electron Bombardment Ion Sources", Symposium on Ion Sources and Formation of Ion Beams, Brookhaven National Laboratory Report 50310, p. 69 (1971). Such magnetic confinement means constrain particle movement without requiring physical contact and may be obtained by choosing particular designs for the ionization chamber and electrode configuration. Thus, physical changes which provide more optimum magnetic fields for confinement may logically produce an ion source with improved ionization efficiency.

The conventional Freeman source is shown in schematic view in FIG. 1. See also L. Valyi, Atom and Ion Sources, pp. 211, et seq. As discussed previously this type of source is used in analyzed systems where uniformity is desired. The single rod electrode 12 is centered within ion source housing 11 axially with respect to the extraction slit 13. Magnet pole pieces 10 create a nonfluctuating magnetic field on the order of 50–150 gauss along the direction of the axis of electrode 12 depending upon the species being ionized. This nonfluctuating field together with the field generated by the current flowing in the electrode (hundreds of gauss near the electrode surface, diminishing outwardly, when the current in the electrode is on the order of a hundred amperes) influences electron travel after emission from electrode 12. A spiral or turbulent trajectory is experienced which tends to keep energetic electrons in the central region where ionizing collisions may be experienced. The superimposed nonfluctuating field is not essential to operation but enhances ionization efficiency. A source of ionizable material, here shown to be a solid 16 surrounded by vaporization heater 17, is positioned adjacent the rod electrode 12. An ionizable gas is thus presented to the region of rod electrode 12. By electron impact the gas is ionized and available for extraction through slit 13 by means of accelerating electrode 14. The extracted beam 15 has a ribbon shape.

Figure 2:
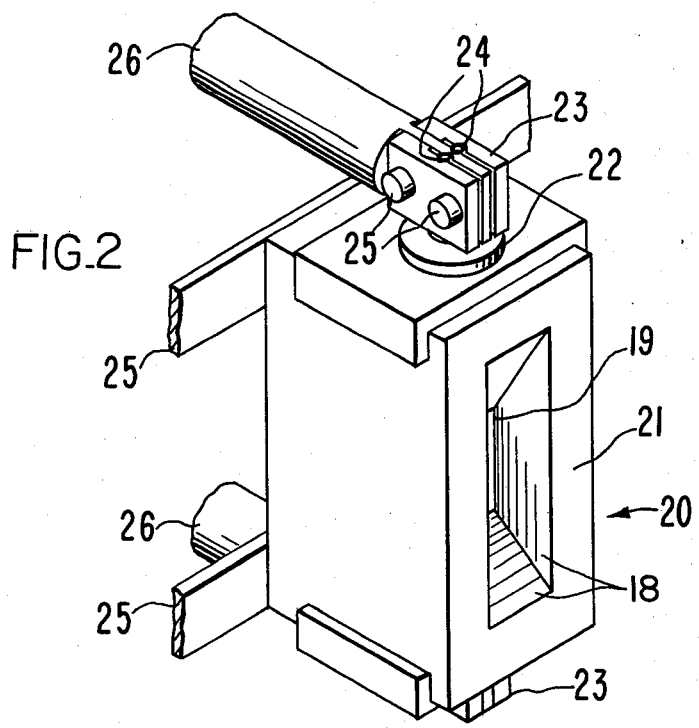
FIG. 2 is a perspective view of a dual filament embodiment of the multiple filament ion source of the present invention.
Figure 3:
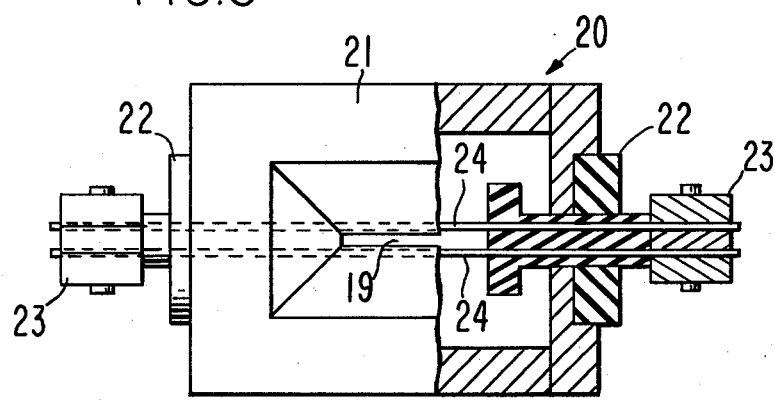
FIG. 3 is a broken away plan view of the ionization chamber of the dual filament embodiment of FIG. 2.

The multiple filament electrode configuration of the present invention is illustrated in FIG. 2. without the external magnets which are in fact typically used in the same manner as shown in FIG. 1 for single filament sources. In the preferred embodiment shown, two parallel rod segments 24 form the electrode and are positioned in opposition within ionization chamber 21 and straddle the extraction slit 19 (shown also in FIG. 3). Extraction slit 19 is formed by the termination of bevelled surfaces 18 which are provided to permit a broadening of the beam after extraction.

In one embodiment the extraction slit is on the order of 100/1000 inches in width, the two parallel segments of the electrode are 60/1000 inches in diameter and are on 120/1000 inch centers. In a preferred embodiment with the same slit and electrode dimensions, the electrodes are on 240/1000 inch centers. In the first embodiment there is a slight solid angle for electrons to pass directly through to the outside, and, more importantly, directly to the substrate; in the second there is none. In either case the electrons are available for collisions with neutral atoms within the ionization chamber. The rod segments 24 are firmly held in a press fit by holder 23 when bolts 25 are tightened and are fed into the ionization chamber 20 through insulators 22. The rod segments are preferably placed in the range of 1/5 to ⅓ of the distance from the slit to the back wall of the ionization chamber in order to maximize the residence time of the required species in a region adjacent the extraction slit. In the preferred embodiment shown, the electrodes are of equal diameter in order to have a balanced and symmetrical magnetic field. The electrodes are typically formed of tungsten. Since dual filament sources may be used as plug-in replacements for single filament sources, the power rating (proportional to the total cross section of the rod segments) may be at least as high. Thus, the power supply for a single filament source drawing 150 amperes would drive a dual filament source having a combined equivalent cross section with 75 amperes flowing through each filament. For power equivalence with two identical small electrodes D single=$\sqrt{2}$ D dual. The surface area is thus increased by $\sqrt{2}$ for two electrodes of equal diameter of the same length. The increase in area would produce greater electron emission for equivalent power consumption or equivalent electron emission at reduced power consumption since emissivity is directly proportional to both temperature and surface area.

Figure 4:
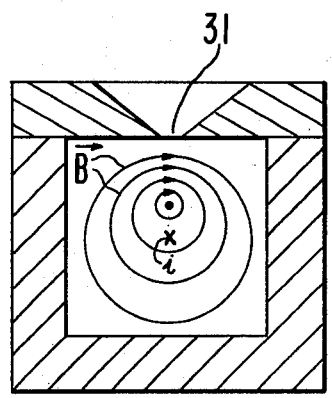
FIG. 4 is a end schematic view of the filament generated magnetic field lines within the ionization chamber of a Freeman configuration surface emission ion source of the prior art.

With the conventional single filament axially centered Freeman type ion source, a portion of the emissions of electrons from the electrode may directly escape through the extraction slit by line-of-sight passage. The electrode also serves to block ions which are created in the reaction chamber from passing through the extraction slit. Each such collision of an ion with the electrode reduces the ion population; the likelihood of such collision is lessened with the straddled configuration of the dual filaments of the ion source of the present invention. The magnetic field, $\vec{B}$, produced by the flowing current, i, is shown in side cross sectional view in FIG. 4. The superimposed fixed strength field lines (into the paper) are not shown. It can be seen that these field lines necessarily occupy the distance between the filament and the slit. Thus the field lines must be compressed within this distance unless the ionization chamber itself is made a part of a larger magnetic circuit so that the field lines continue into the walls of the ionization chamber, an arrangement which would make it difficult to prevent particle collisions with the walls of the chamber. Thus, ions produced within the chamber must traverse these compacted lines of magnetic field strength and may be steered into neutralizing collisions with the walls of the ionization chamber adjacent the extraction slit thereby decreasing ionization efficiency.

Figure 5:
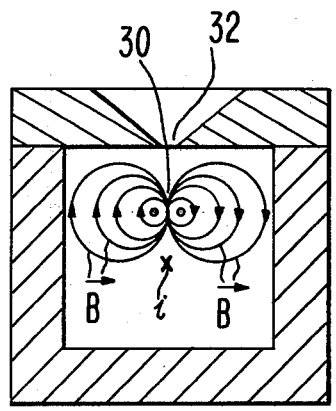
FIG. 5 is an end schematic view of the filament generated magnetic field lines within the ionization chamber of the dual filament embodiment of FIG. 2.

The magnetic field associated with the dual filament configuration is shown in FIG. 5. Equipotential magnetic field lines, $\vec{B}$, surround each electrode in the same manner since filament current, i, travels in the same direction in each. The magnetic field in the region directly between the two filaments is weak due to cancellation and thus neutralizing collisions will be minimized in this region through which ions are being extracted. This is contrasted to the strong magnetic fields present in the exit aperture region of the conventional source of FIG. 4. Superimposed on this magnetic field is the fixed field shown in FIG. 1 to be orthogonal to the plane of the drawing or along the axis of the electrode. These two field components produce a complex spiral-like or turbulent trajectory for electrons so they will likely engage in ionizing collisions.

The sputtering of the constituent metal atoms of the electrode in an electron bombardment ion source is one mechanism of degradation. This sputtering is produced both by bombardment of energetic atomic species produced within the ionization chamber and by energetic species which backstream into the chamber from outside. The internal energetic species include ions of the type otherwise extracted as well as neutral species which have been neutralized after ionization and acceleration within the chamber. These internally generated energetics will not have very high kinetic energy since the potential through which they have been accelerated will be the bias potential of the electrode (hundreds of volts); even so, it has been found that electrode life is optimum for the lowest bias potential consistent with the sustaining of adequate electrode emission. Externally generated energetics will include electrons, negative ions and even neutrals which have accelerated back-up through the extraction fields which are on the order of tens of thousands of volts; these external energetics may have high kinetic energy and may cause significant sputtering. Such back sputtering produces the phenomonen of 'necking' whereby the electrode gets thinner in the center portion where is its exposed to back streaming ions. This back sputtering depends upon the density of back streaming ions and upon the electrical field through which they are accelerated. Both back sputtering and sputtering by ions being extracted are being reduced by the straddled configuration of the electrode segments of the ion source of the present invention. In addition, the operating temperature of the electrodes will determine how easily surface atoms can be removed by impinging energetics: the higher the operating temperature, the more extensive the sputtering. These combined effects are basically a linear (or low order) function of temperature. Thus, the multiple filament ion source of the present invention with lower effective operating temperature reduces this effect as a linear (or low order) function of temperature for both internally and externally generated energetics. In the preferred embodiments in which the multiple segments of the electrode are not in line-of-sight locations with respect to the substrate the back sputtering component is eliminated and overall sputtering is reduced substantially. The improvement in either case, however, is secondary to the improvement due to losing less material at the surface due to "boil off" as contrasted to electron guns where the improvment is primary. See, e.g., U.S. Pat. No. 3,701,915, at column 5, lines 14-24. The difference lies in the fact that temperature dependent materials evaporation and sputtering due to the hostile internal plasma environment produce even greater degradation than back streaming ions.

We claim:

1. An electron-bombardment ion source having an electrode mounted within an ionization chamber, a power supply to provide electrical current to said electrode to heat it resistively to produce thermionic emission of electrons, an external magnet for superimposing a magnetic field on the interior of the ionization chamber, means for providing ionizable material to said ionization chamber, and an ion extraction aperture formed in a wall of said ionization chamber, the improvement comprising:

the electrode is composed of two parallel segments mounted symmetrically inside said ionization chamber along opposing edges of said extraction aperture and oriented with parallel axes aligned with said magnetic field.

2. An electron-bombardment ion source as defined in claim 1 wherein said two parallel electrode segments are mounted so that no line of sight, electrode to target, passage exists for electrons emitted from said segments.

3. An electron-bombardment ion source as defined in claim 2 wherein said two parallel electrode segments are positioned in the range of from 1/5 to ⅓ of the distance from the inner side of said extraction aperture to the back wall of said ionization chamber.

4. An electron-bombardment ion source having an electrode mounted within an ionization chamber, a power supply to provide electrical current to said electrode to heat it resistively to produce thermionic emission of electrons, an external magnet for superimposing a magnetic field on the interior of the ionization chamber, means for providing ionizable material to said ionization chamber, and an ion extraction aperture formed in a wall of said ionization chamber, the improvement comprising:

the electrode is composed of two segments electrically connected in parallel and oriented with parallel axes aligned with said magnetic field so that when the cumulative electrode cross section for said two segments is equivalent to that of a single electrode the total surface area for emission of said two segments is $\sqrt{2}$ the surface area of emission of said single electrode, said two parallel electrode segments being mounted symmetrically inside said ionization chamber along opposing edges of said extraction aperture so that no line of sight, electrode to target, passage exists for electrons emitted from said segments.

5. An electron-bombardment ion source in accordance with claim 4 wherein said two parallel electrode segments are composed of tungsten and are of equal diameter.

6. An electron-bombardment ion source in accordance with claim 5 wherein said two parallel electrode segments are positioned in the range of from 1/5 to ⅓ of the distance from the inner side of said extraction aperture to the back wall of said ionization chamber.

* * * * *